(12) United States Patent
Stankovski et al.

(10) Patent No.: US 12,051,877 B2
(45) Date of Patent: Jul. 30, 2024

(54) ETHERNET BRIDGE MOUNTING ARRANGEMENT

(71) Applicant: PPC BROADBAND, INC., East Syracuse, NY (US)

(72) Inventors: Steve Stankovski, Clay, NY (US); David Barany, Syracuse, NY (US); Noah P. Montena, Syracuse, NY (US); Harold J. Watkins, Chittenango, NY (US); Daniel Daoust, Syracuse, NY (US)

(73) Assignee: PPC BROADBAND, INC., East Syracuse, NY (US)

( * ) Notice: Subject to any disclaimer, the term of this patent is extended or adjusted under 35 U.S.C. 154(b) by 0 days.

(21) Appl. No.: 18/228,470

(22) Filed: Jul. 31, 2023

(65) Prior Publication Data

US 2023/0378701 A1 Nov. 23, 2023

Related U.S. Application Data

(63) Continuation of application No. 17/983,288, filed on Nov. 8, 2022, now Pat. No. 11,742,623, which is a
(Continued)

(51) Int. Cl.
*H01R 13/73* (2006.01)
*H01R 13/502* (2006.01)
*H01R 24/76* (2011.01)

(52) U.S. Cl.
CPC ........... *H01R 13/73* (2013.01); *H01R 13/502* (2013.01); *H01R 24/76* (2013.01); *H01R 2201/04* (2013.01)

(58) Field of Classification Search
CPC ...... H01R 13/73; H01R 13/502; H01R 24/76; H01R 2201/04; H05K 5/0204; H04N 7/106
See application file for complete search history.

(56) References Cited

U.S. PATENT DOCUMENTS 4,850,014 A * 7/1989 Gillis ..................... H04Q 1/028
D14/240
6,242,697 B1 * 6/2001 Gerken .................. H02G 3/085
248/68.1
(Continued)

FOREIGN PATENT DOCUMENTS

KR 20110054202 A 5/2011

OTHER PUBLICATIONS

Search Report dated Jul. 21, 2021 in corresponding International Application No. PCT/US2021/029010, 2 pages.
(Continued)

*Primary Examiner* — Abdullah A Riyami
*Assistant Examiner* — Nader J Alhawamdeh
(74) *Attorney, Agent, or Firm* — MH2 TECHNOLOGY LAW GROUP LLP

(57) ABSTRACT

An ethernet bridge mounting arrangement includes a housing including a cover portion and a back portion and a wall mount. The housing is configured to be coupled with the wall mount, and the housing is rotatable relative to the wall mount about an axis that extends in a direction perpendicular to a rear surface of the housing between a first rotational orientation, where latching members extending from the housing can be received by and removed from latch openings in the wall mount, and a second rotational orientation, where the housing is prevented from being pulled away from the wall plate.

25 Claims, 9 Drawing Sheets

Related U.S. Application Data continuation of application No. 17/239,542, filed on Apr. 23, 2021, now Pat. No. 11,495,924.

(60) Provisional application No. 63/014,692, filed on Apr. 23, 2020.

(56) References Cited

U.S. PATENT DOCUMENTS

| | | | |
|---|---|---|---|
| 6,404,641 B1 | 6/2002 | Fisk et al. | |
| 6,661,961 B1 | 12/2003 | Allen et al. | |
| 9,882,362 B2* | 1/2018 | Carapella | G02B 6/4448 |
| 2009/0202214 A1 | 8/2009 | Holmberg et al. | |
| 2009/0314907 A1* | 12/2009 | Romerein | H04M 1/0293 |
| | | | 248/205.1 |
| 2014/0160717 A1 | 6/2014 | Malzone, Jr. et al. | |
| 2015/0250315 A1 | 9/2015 | Gross et al. | |
| 2016/0091683 A1* | 3/2016 | Carapella | H02G 3/16 |
| | | | 385/135 |
| 2018/0017242 A1* | 1/2018 | Johnson | H05B 47/19 |
| 2018/0310430 A1 | 10/2018 | Franck et al. | |

OTHER PUBLICATIONS

Written Opinion dated Jul. 21, 2021 in corresponding International Application No. PCT/US2021/029010, 6 pages.
Extended European Search Report dated May 17, 2024 in corresponding European Application No. 21792078.4, 7 pages.

* cited by examiner

ETHERNET BRIDGE MOUNTING ARRANGEMENT

CROSS-REFERENCE TO RELATED APPLICATION

This application is a continuation of U.S. application Ser. No. 17/983,288 filed on Nov. 8, 2022, which is a continuation of U.S. application Ser. No. 17/239,542 filed on Apr. 23, 2021, now U.S. Pat. No. 11,495,924, which claims the benefit of U.S. Provisional Application No. 63/014,692, filed on Apr. 23, 2020, the disclosures of which are incorporated herein by reference in their entireties.

TECHNICAL FIELD

The present disclosure relates to an ethernet bridge mounting arrangement and, more particularly, to an ethernet bridge mounting arrangement that can be mounted to a wall with or without a junction box.

BACKGROUND

Typical homes built before the internet era were not wired with high speed data cables. However, since cable television existed long before the internet, many homes were built with radio frequency (RF) cable installed behind the walls or have been retrofitted to include RF cable behind the walls. Such RF cable is terminated at a junction box (e.g., single gang junction box or larger) or passed through an opening in a wall to provide a connection to a component (e.g., a set top box, digital video recorder, or the like) configured to receive signals via the RF cable.

Present in-home entertainment networks, local area networks, and/or VoIP phones require data transmission over an ethernet cable (e.g., an 8-wire twisted pair ethernet cable). Some conventional ethernet bridges are configured to receive data signals via an RF cable, process the signals, and distribute electronic signals via an RF output port and/or an ethernet port (e.g., an RJ45 port). A user can then connect an ethernet cable to the ethernet port to direct electronic signals from the ethernet port to a first component and/or connect an RF cable to the RF output port to direct electronic signals from the RF output port to a second component. The first and second components may be provided as separate devices or as a single device.

Conventional ethernet bridges typically include an RF input port extending from an exterior surface of the bridge housing. Thus, a user must connect an RF input cable to an RF port of a wall plate and to the RF input port of the ethernet bridge. Alternatively, the user must connect an RF input cable that extends through an opening in the wall to the RF input port of the ethernet bridge. In either case, the RF input cable is visible as it extends from the wall and may clutter and/or distract from the appearance of a room.

Therefore, it may be desirable to provide an arrangement for mounting an ethernet bridge to a wall so as to minimize the space occupied by the ethernet bridge and avoid the undesirable presence of cable extending from a wall of the room. It may also be desirable to provide an ethernet bridge mounting arrangement that can be mounted to a wall with or without a junction box. It may further be desirable to provide an ethernet bridge mounting arrangement having a housing that can be removed from a wall plate without tools and without removing cable that are attached to external ports of the housing.

SUMMARY

According to various aspects of the present disclosure, an ethernet bridge mounting arrangement includes a housing including a cover portion and a back portion and a wall mount. The housing is configured to be coupled with the wall mount, and the housing is rotatable relative to the wall mount about an axis that extends in a direction perpendicular to a rear surface of the housing between a first rotational orientation, where latching members extending from the housing can be received by and removed from latch openings in the wall mount, and a second rotational orientation, where the housing is prevented from being pulled away from the wall plate.

In some aspects, the ethernet bridge mounting arrangement further includes a locking arrangement configured to lock the housing and the wall mount in the second rotational orientation.

In various aspects, the ethernet bridge mounting arrangement further includes a circuit board sandwiched between the cover portion and the back portion.

The foregoing and other features of construction and operation of the invention will be more readily understood and fully appreciated from the following detailed disclosure, taken in conjunction with accompanying drawings.

BRIEF DESCRIPTION OF THE DRAWINGS

In the accompanying figures, like elements are identified by like reference numerals among the several exemplary embodiments of the present disclosure.

DETAILED DESCRIPTION OF EMBODIMENTS

As a preface to the detailed description, it should be noted that, as used in this specification and the appended claims, the singular forms "a," "an," and "the" include plural referents, unless the context clearly dictates otherwise.

Figure 1:
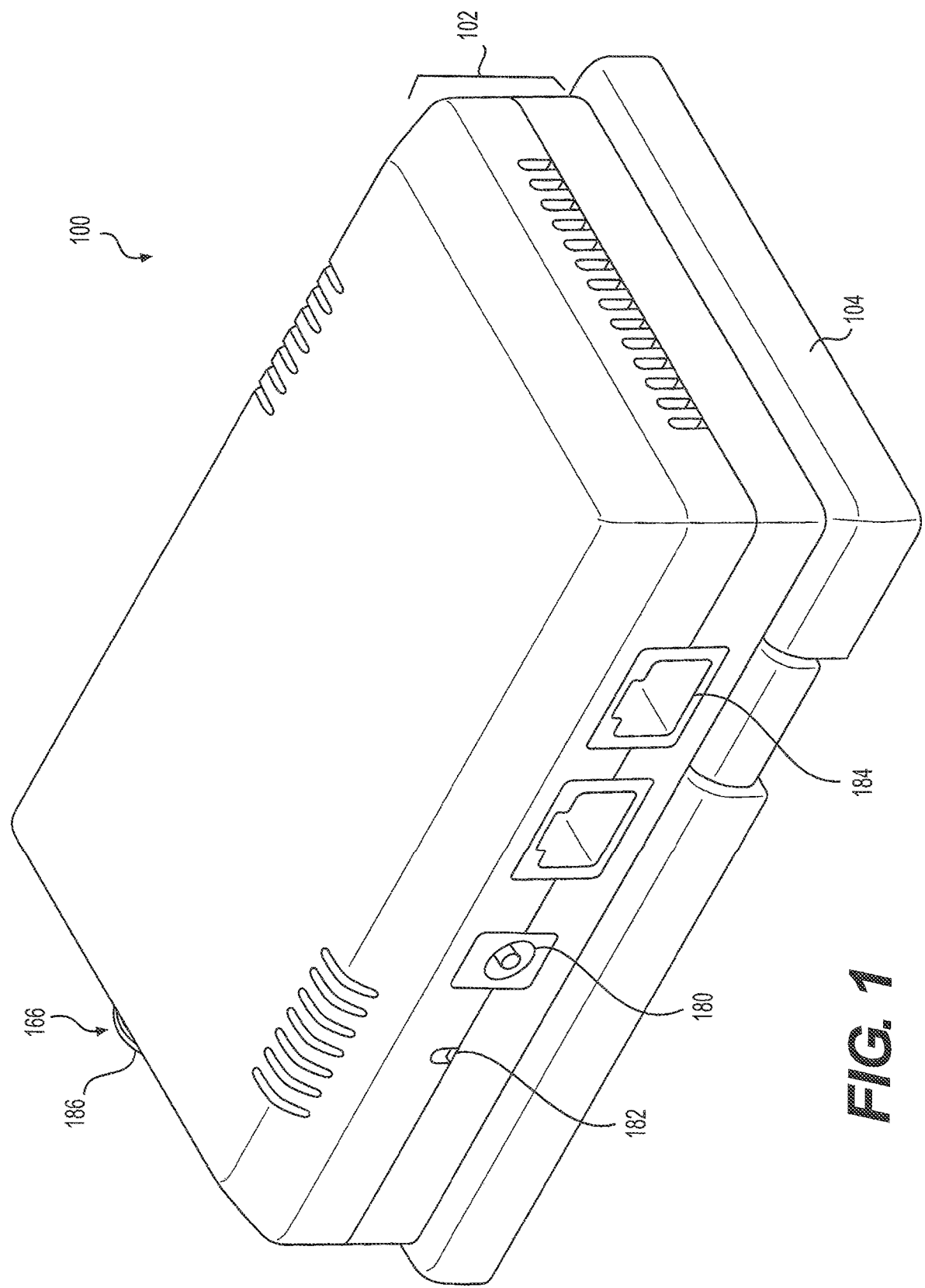
FIG. 1 is a perspective view of an exemplary ethernet bridge mounting arrangement in accordance with various aspects of the disclosure.
Figure 2:
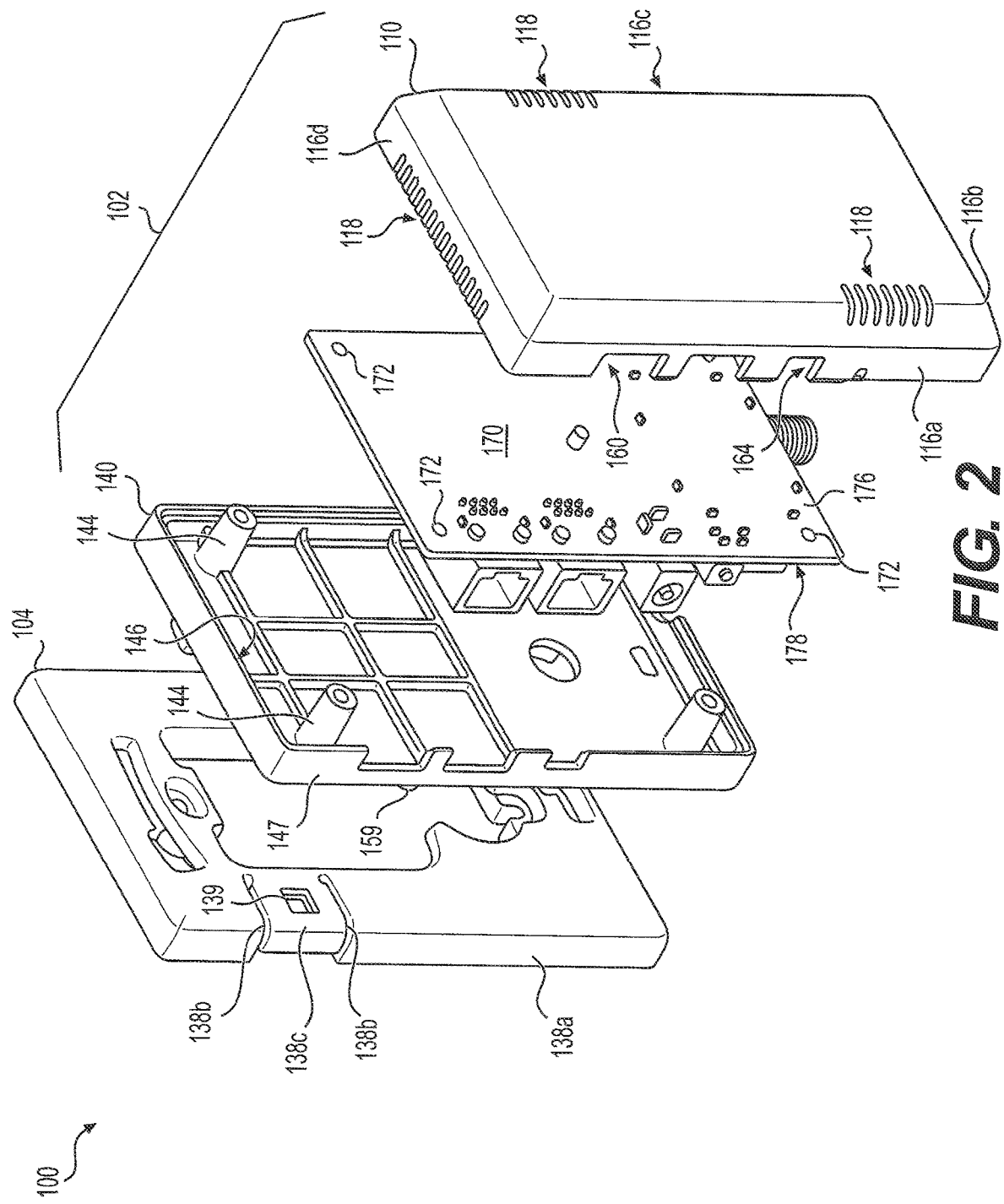
FIG. 2 is an exploded front/side perspective view of the ethernet bridge mounting arrangement of FIG. 1.
Figure 3:
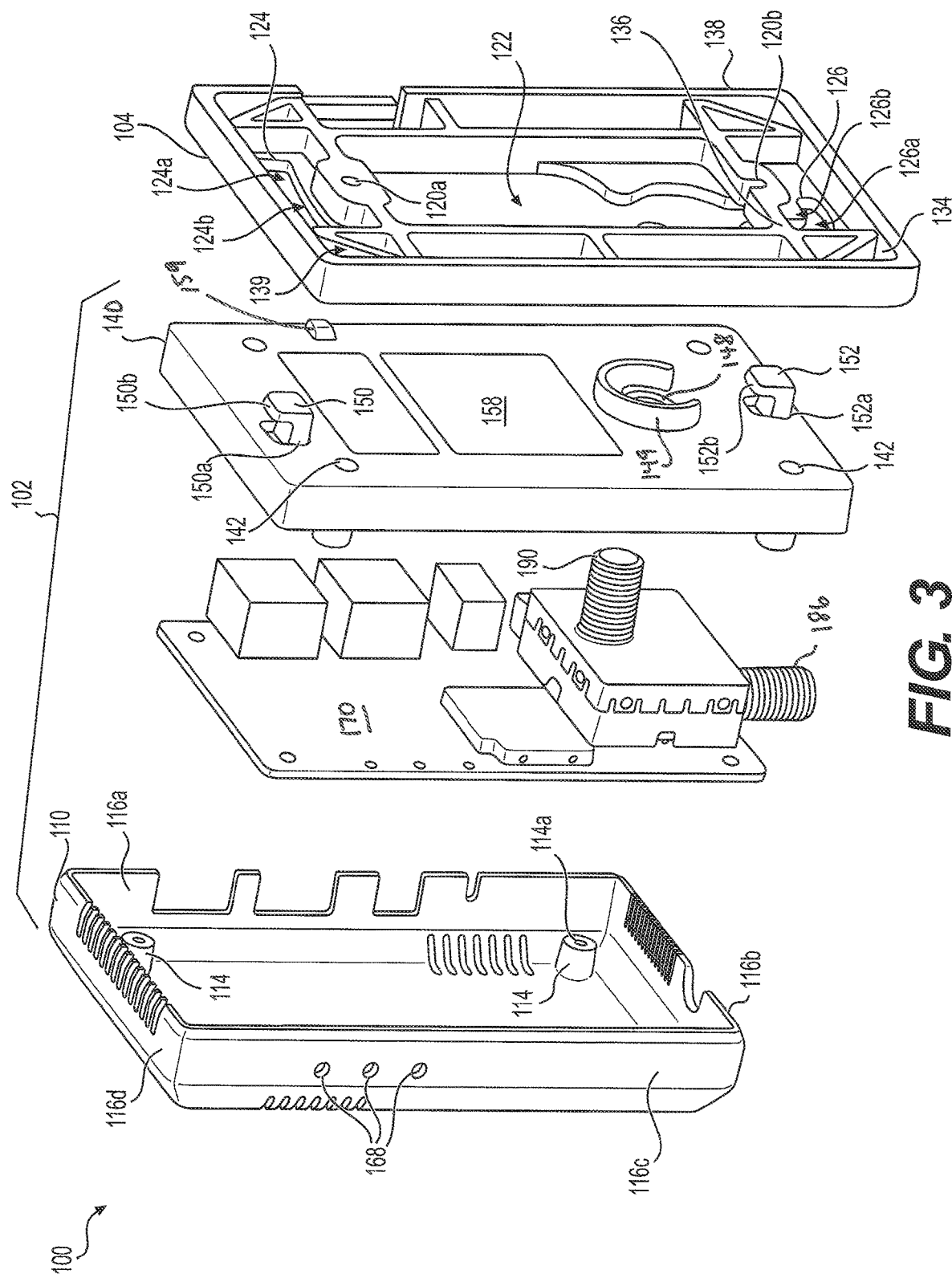
FIG. 3 is an exploded rear/side perspective view of the ethernet bridge mounting arrangement of FIG. 1.

Referring to FIG. 1, an exemplary ethernet bridge mounting arrangement 100 in accordance with various aspects of the disclosure is illustrated and described. The ethernet bridge mounting arrangement 100 includes a housing 102 and a wall mount 104 (or wall plate). As shown in FIGS. 2 and 3, the housing 102 includes a cover portion 110 (or cover plate portion), a back portion 140 (or backplate portion), and a circuit board 170, for example a printed circuit board. The circuit board 170 may be fixedly coupled with the cover portion 110 and the back portion 140 as described below. For example, in some aspects, the circuit board 170 is structured and arranged to fit between the cover portion 110 and the back portion 140.

The cover portion 110 may be fixedly coupled with the back portion 140 via a plurality of fasteners (not shown). For example, as best illustrated in FIG. 3, a rear surface 112 of the cover portion 110 may include one or more bosses 114 extending toward the back portion 140. Although the illustrated embodiment includes four bosses 114, only two of the bosses are visible in FIG. 3, as the other two bosses are obscured by a side wall of the cover portion 110.

The back portion 140 may include holes 142 extending through bosses 144 that extend from a front surface 146 of the back portion 140 and are configured to be aligned with the respective bosses 114 of the cover portion 110. The circuit board 170 may also include holes 172 configured to be aligned with the holes 142 through the back portion 140 and the bosses 114 of the cover portion 110. The holes 142 through the back portion 140, the holes 172 through the circuit board 170, and the bosses 114 are configured to receive a fastener (not shown), for example, a threaded fastener, for fixedly coupling the circuit board 170 with the cover portion 110 and the back portion 140. In some aspects, in place of one or more of the holes 172, the circuit board 170 may include a protrusion (not shown), for example, a pin, extending from a front surface 176 of the circuit board 170 and configured to be received in a hole 114a in one of the bosses 114 on the cover portion 110. The protrusion and hole 114a may facilitate relative alignment between the cover portion 110 and the circuit board 170 during assembly of the housing 102.

The circuit board 170 may include electronic circuits (e.g., circuits associated with an ethernet bridge or MoCA bridge) between a rear surface 178 of the circuit board 170 and the front surface 146 of the back portion 140. When the cover portion 110 and the back portion 140 are coupled together, side walls 116a, 116b, 116c, 116d cover spaces between the circuit board 170 and the back portion 140. One or more of the side walls 116a, 116b, 116c, 116d may include one or more vent openings 118 configured to dissipate heat from the circuit board 170.

Figure 4:
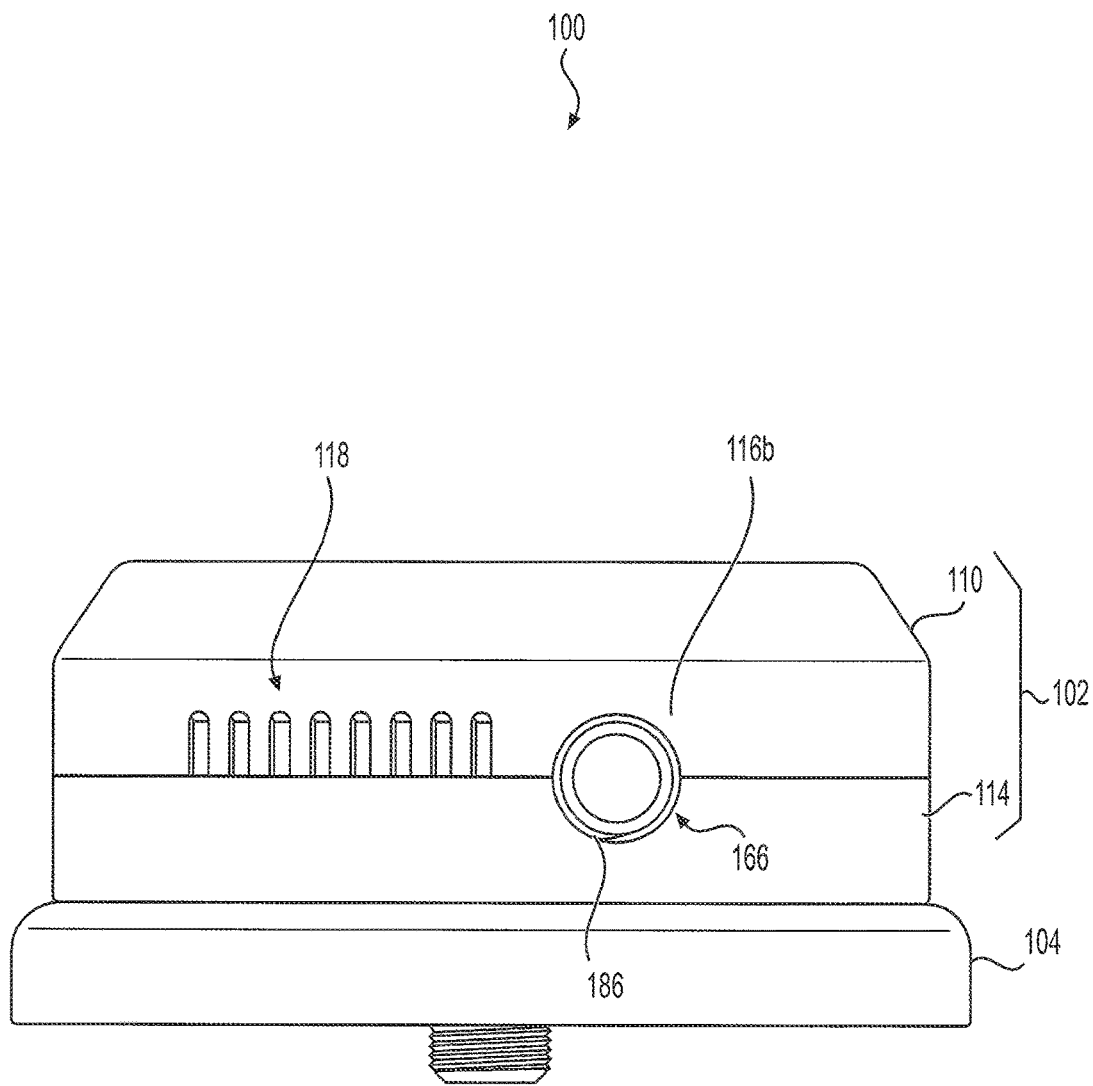
FIG. 4 is a bottom view of the ethernet bridge mounting arrangement of FIG. 1.
Figure 5:
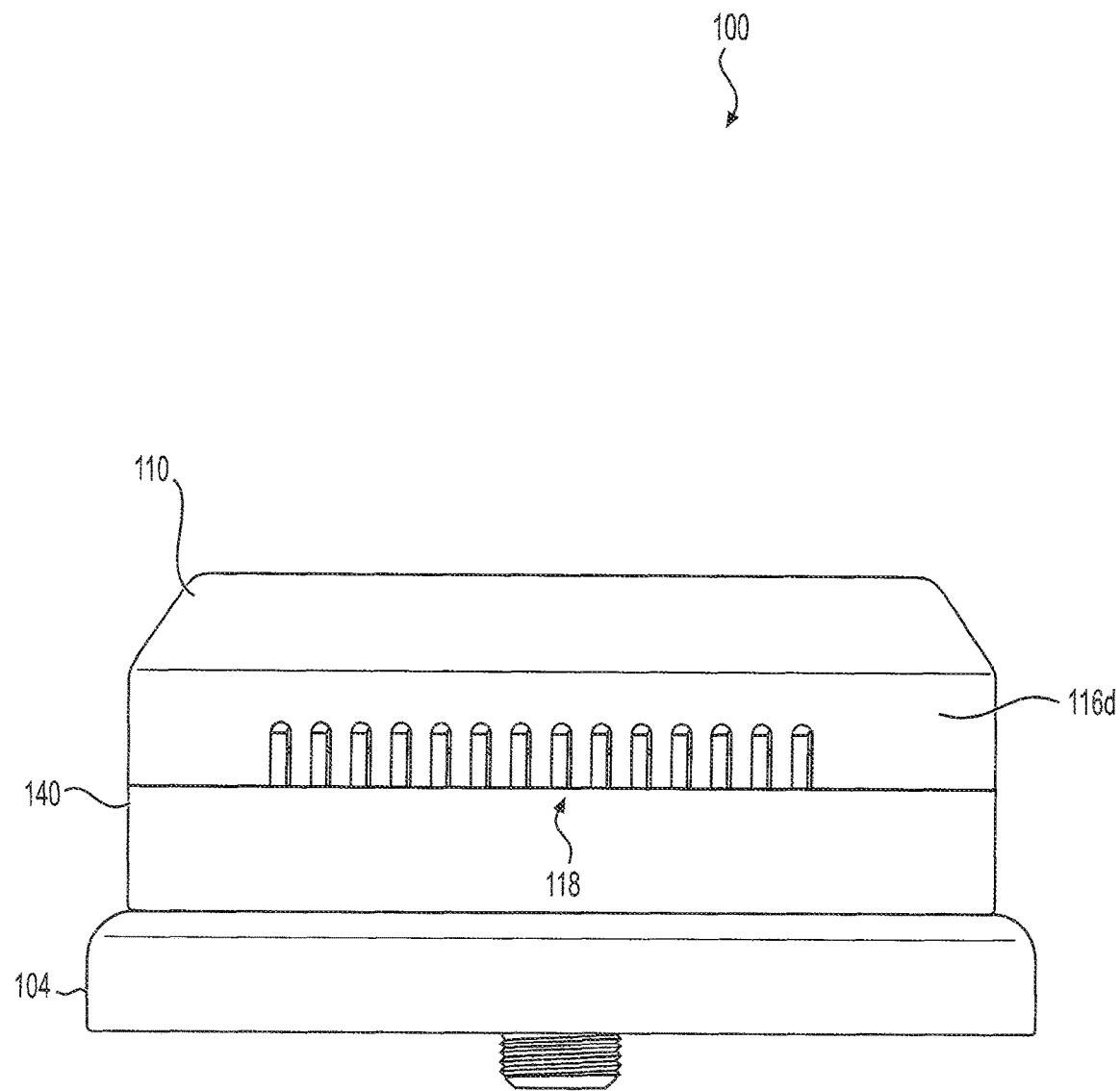
FIG. 5 is a front view of the ethernet bridge mounting arrangement of FIG. 1.
Figure 6:
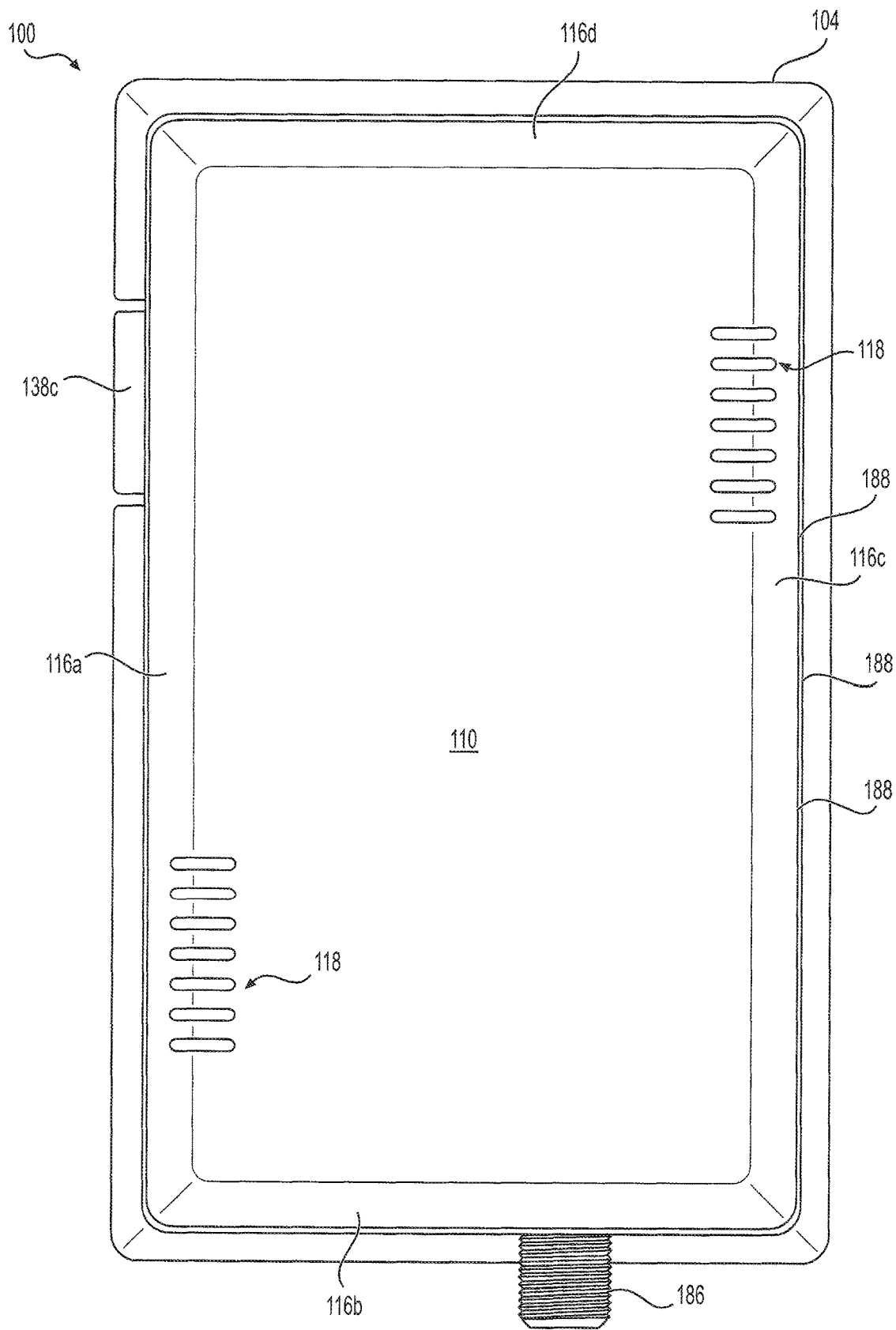
FIG. 6 is a first side view of the ethernet bridge mounting arrangement of FIG. 1.
Figure 7:
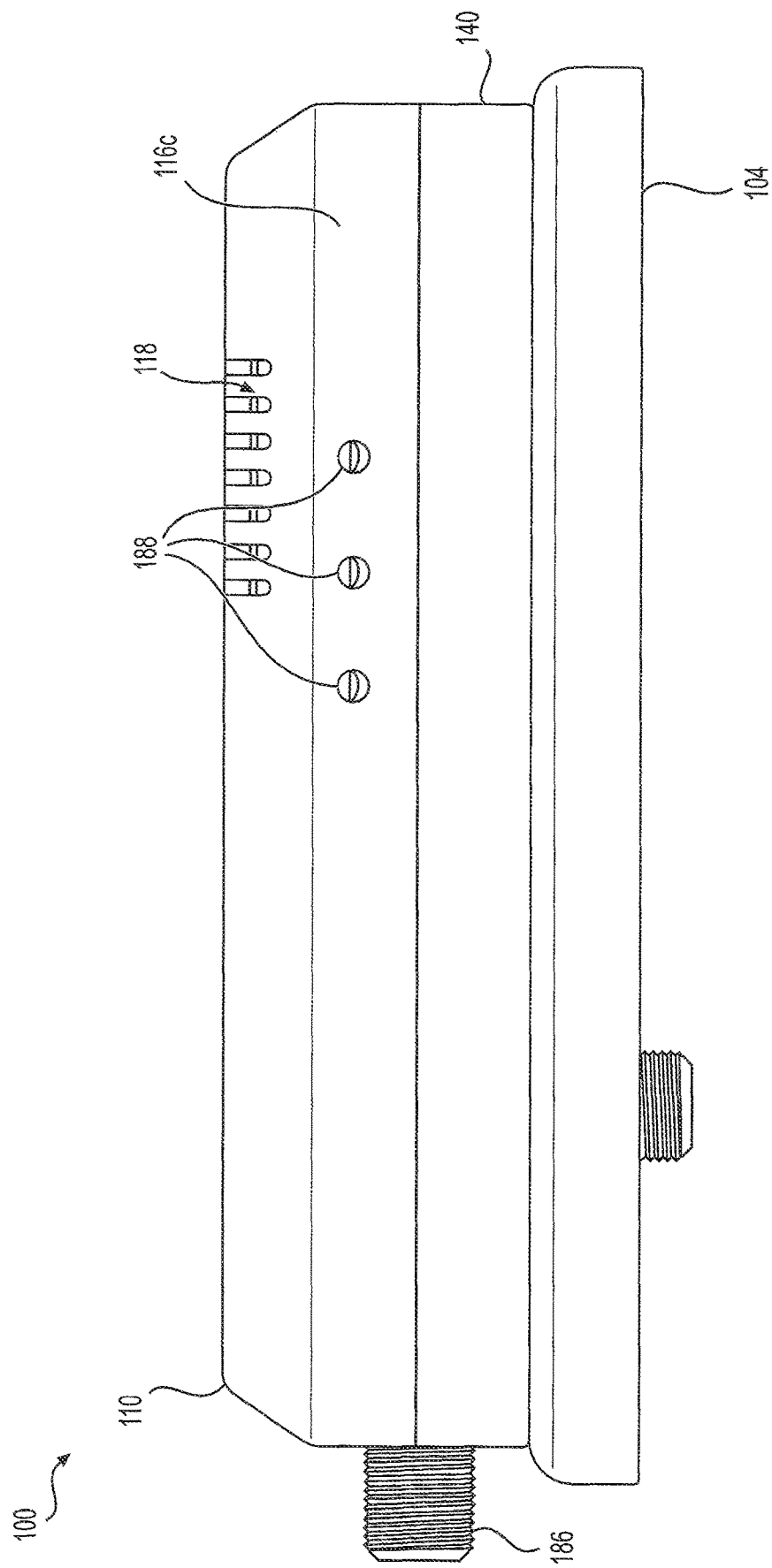
FIG. 7 is a top view of the ethernet bridge mounting arrangement of FIG. 1.
Figure 8:
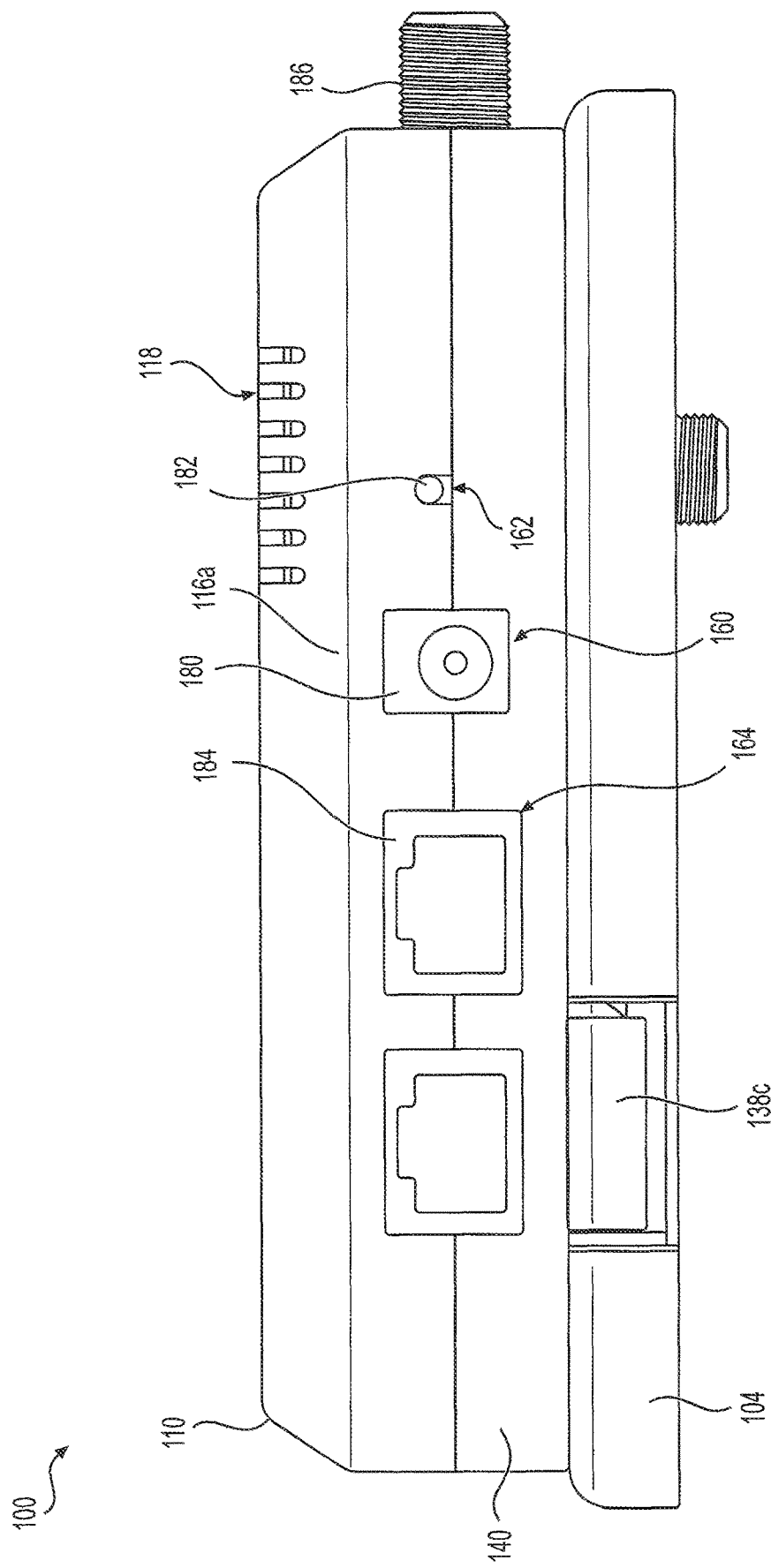
FIG. 8 is a second side view of the ethernet bridge mounting arrangement of FIG. 1.

The circuit board 170 also includes various connections that are open to an outside of the housing 102 via one or more of the side walls 116a, 116b, 116c, 116d. For example, as best illustrated in FIGS. 2 and 8, the circuit board 170 may be electrically coupled with a power port 180, a reset button 182, and one or more RJ45 ports 184 (i.e., ethernet ports) disposed through respective openings 160, 162, 164, for example, complementary openings, in the first side wall 116a of the cover portion 110 and an adjacent wall of the back portion 140. The circuit board 170 is electrically coupled with an RF port 186 disposed through an opening 166, for example, a complementary opening, in the second side wall 116b of the cover portion 110, as best illustrated in FIGS. 4 and 5. Further, the circuit board 170 may be electrically coupled with one or more indicators 188, for example, LED lights disposed through respective openings 168, for example, complementary openings, in the third side wall 116c of the cover portion 110, as best illustrated in FIGS. 3, 5, and 6. The indicators 188 may be configured to signal, for example, the power condition of the ethernet bridge mounting arrangement 100 and/or the operable/inoperable condition of the RJ45 port 184 and/or the RF port 186.

Figure 9:
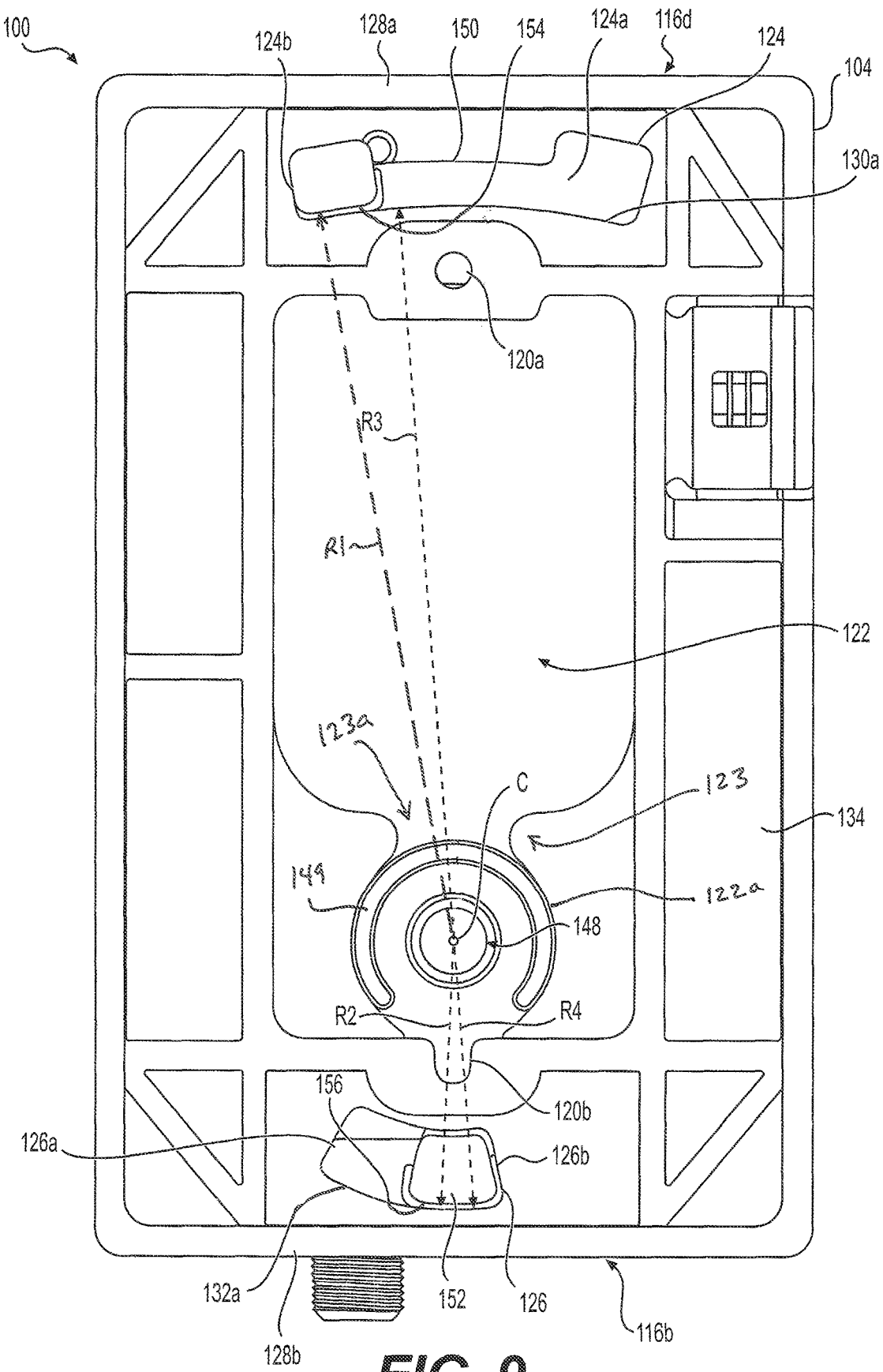
FIG. 9 is a rear view of the ethernet bridge mounting arrangement of FIG. 1.

Referring now to FIGS. 2 and 9, the back portion 140 has an opening 148 configured to receive an RF input port 190 that is electrically coupled with the circuit board 170 and extends from the rear surface 178 of the circuit board 170 and through the opening 148. The RF input port 190 is configured to receive an RF input cable (not shown), for example, via a threaded coupling (not shown) that terminates the cable and is configured to be coupled with the RF input port 190. The electronic circuits of the circuit board 170 may be configured to receive electronic signals from the RF input port 190 and/or to send electronic signals to the RF input port 190. The electronic circuits of the circuit board 170 may also be configured to process the electronic signals received from the RF input port 190, send electronic signals to the RF port 186 and/or the one or more RJ45 ports 184, and/or process electronic signals received from the RF port 186 and/or the one or more RJ45 ports 184. For example, the housing 102 may comprise an ethernet bridge or a MoCA bridge. The power port 180 may be configured to receive electrical power from a power source (not shown) to power the circuit board 170, and the reset button 182 may be configured to actuate a reset operation of the circuit board 170.

The back portion 140 includes a rear surface 158 having a first latch 150 and a second latch 152 extending therefrom. A distance R1 between a center C of the opening 148 through the back portion 140 and an inner edge 154 of the first latch 150 is greater than a distance between the center C of the opening 148 through the back portion 140 and an outer edge 156 of the second latch 152. As best illustrated in FIG. 9, the first latch 150 is proximate the fourth side wall 116d, and the second latch 152 is similarly proximate the second side wall 116b. Meanwhile, the opening 148 is nearer to the second side wall 116b than to the fourth side wall 116d. If the back portion 140 is rotated about an axis extending through the center C of the opening 148 and perpendicular to a rear surface 158 of the back portion 140, the distance R1 corresponds to a radius of curvature of a path of the inner edge 154 of the first latch 150 relative to the center C, and the distance R2 corresponds to a radius of curvature of a path of the outer edge 156 of the second latch 152 relative to the center C.

Referring now to FIGS. 2, 3, and 9, the wall mount 104 includes a wall portion 134, for example, a planar wall, having a thickness in a direction perpendicular to a rear surface 158 of the back portion 140. The wall portion 134 is supported by a plurality of ribs 136 and side walls 138 extending from a rear surface 139 of the wall portion 134. The wall mount 104 includes openings 120a, 120b through the wall portion 134. The openings 120a, 120b are sized and arranged to be aligned with mounting holes (not shown) of a standard size electrical junction or outlet box or a low voltage mounting bracket (not shown) such that the wall mount 104 can be mounted to a structural wall (not shown), as would be understood by persons of ordinary skill in the art. Alternatively, the wall mount 104 may be mounted directly to the structural wall via a stud and/or a wall anchor, as would be understood by persons of ordinary skill in the art.

The wall mount 104 further includes a center opening 122 between the openings 120a, 120b. The center opening 122 spans the distance between the openings 120a, 120b in a first direction and approximately half of the width of the wall mount 104 in a second direction perpendicular to the first direction. The center opening 122 is structured and arranged to permit the RF input port 190 and/or the RF input cable and threaded coupling that terminates the cable and is configured to be coupled with the RF input port 190 to pass therethrough.

The wall mount 104 also includes a first latching opening 124 and a second latching opening 126 at opposite ends of the wall mount 104. For example, the first latching opening 124 is disposed between a first one of the openings 120a and a first end 128a of the wall mount 104 on an opposite side of the opening 120a relative to the center opening 122. Similarly, the second latching opening 126 is disposed between a second one of the openings 120b and a second end 128b of the wall mount 104 on an opposite side of the opening 120b relative to the center opening 122.

As shown in FIG. 9, when the housing 102 is coupled with the wall mount 104, an inner wall 130a of the first latching opening 124 is arranged to be spaced from center C of the opening 148 through the back portion 140 by a distance R3 that is substantially the same as the distance R1 that the inner edge 154 of the first latch 150 is spaced from the center C of the opening 148. However, the distance R1 may be slightly greater than the distance R3 such that the first latch 150 is configured to slide relative to the inner wall 130a of the first latching opening 124 when the housing 102 is rotated relative to the wall mount 104 about the axis extending through the center C of the opening 148 and perpendicular to a rear surface 158 of the back portion 140.

Similarly, when the housing 102 is coupled with the wall mount 104, an outer wall 132a of the second latching opening 126 is arranged to be spaced from center C of the opening 148 through the back portion 140 by a distance R4 that is substantially the same as the distance R2 that the outer edge 156 of the second latch 152 is spaced from the center C of the opening 148. However, the distance R4 may be slightly greater than the distance R2 such that the second latch 152 is configured to slide relative to the outer wall 132a of the second latching opening 126 when the housing 102 is rotated relative to the wall mount 104 about the axis extending through the center C of the opening 148 and perpendicular to a rear surface 158 of the back portion 140.

As illustrated, the first latching opening 124 includes a first portion 124a that has a larger dimension than a second portion 124b in a radial direction extending from the center C of the opening 148. The second latching opening 126 includes a first portion 126a that has a larger dimension than a second portion 126b in a radial direction extending from the center C of the opening 148.

As best illustrated in FIG. 3, the first latch 150 includes a first portion 150a that extends from the rear surface 158 of the back portion 140 in a direction toward the wall mount 104 and a lip 150b that extends from the first portion 150a in a direction substantially parallel to the rear surface 158. A dimension of the lip 150b in the radial direction extending from the center C of the opening 148 is smaller than the dimension of the first portion 124a the radial direction extending from the center C of the opening 148, and a dimension of the lip 150b in a circumferential direction relative to the radial direction extending from the center C of the opening 148 is smaller than the dimension of the first portion 124a in the circumferential direction. Thus, the first portion 150a is configured to insertingly receive the lip 150b when the housing 102 is in a first rotational orientation relative to the wall mount 104.

Similarly, the second latch 152 includes a first portion 152a that extends from the rear surface 158 of the back portion 140 in a direction toward the wall mount 104 and a lip 152b that extends from the first portion 152a in a direction substantially parallel to the rear surface 158. A dimension of the lip 152b in the radial direction extending from the center C of the opening 148 is smaller than the dimension of the first portion 126a the radial direction extending from the center C of the opening 148, and a dimension of the lip 150b in a circumferential direction relative to the radial direction extending from the center C of the opening 148 is smaller than the dimension of the first portion 126a in the circumferential direction. Thus, the first portion 126a is configured to insertingly receive the lip 152b when the housing 102 is in the first rotational orientation relative to the wall mount 104.

The lips 150b, 152b are spaced from the rear surface 158 of the back portion 140 by a distance that is greater than the thickness of the wall 134. Thus, when the lips 150b, 152b of the first and second latches 150, 152 are inserted through the first portions 124a, 126a of the first and second latching openings 124, 126, the housing 102 can be rotated relative to the wall mount 104 from the first rotational orientation to a second rotational orientation where the lips 150b, 152b of the first and second latches 150, 152 are aligned with the second portions 124b, 126b of the first and second latching openings 124, 126. In the second rotational orientation or latch position, the lips 150b, 152b of the first and second latches 150, 152 overlie the rear surface 139 of the wall 134 in the direction perpendicular to the rear surface 158 of the back portion 140.

In the second rotational orientation, the housing 102 is securely fixed to the wall mount 104, and the housing 102 cannot be removed from the wall mount 104 by merely pulling the housing 102 away from the wall mount 104. In order for the housing 102 to be removed from the wall mount 104, the housing 102 must be rotated relative to the wall mount 104 from the second rotational orientation to the first rotational orientation. The distance between the lips 150b, 152b and the rear surface 158 of the back portion 140 in the perpendicular direction may be approximately equal to the thickness so that the rear surface 158 of the back portion 140 may be held close to the wall 134 to minimize relative movement between the housing 102 and the wall mount 104.

Referring again to FIGS. 2 and 3, the back portion 140 of the housing 102 includes a locking member 159 proximate a side wall 147 of the back portion 140. The locking member 159 extends from the rear surface 158 of the back portion 140 toward the wall mount 104. The wall mount 104 includes a lock receptacle 139, for example, a hole or a groove, configured to receive the locking member 159. The lock receptacle 139 is disposed proximate one of the side walls 138a of the wall mount 104. When the locking member 159 is disposed in the lock receptacle 139, the housing 102 is prevented from being rotated relative to the wall mount 104.

The side wall 138a includes a pair of slots 138b spaced apart along the side wall 138a and extending into the wall mount 104. The slots 138b define a release member 138c therebetween. The release member 138c can be pressed toward a structural wall in a direction away from the rear surface 158 of the back portion 140 to disengage the locking member 159 from the lock receptacle 139 so that the housing 102 can be rotated relative to the wall mount 104 from the second rotational orientation to the first rotational orientation. In the first rotational orientation, the housing 102 can be pulled away from the wall mount 104. When rotating the housing 102 relative to the wall mount 104 from the first rotational orientation to the second rotational orientation, the locking member 159 is configured to press the release member 138c toward the structural wall in the direction away from the rear surface 158 of the back portion 140 so that the locking member 159 can be received in the lock receptacle 139.

Because the housing 102 is configured to rotate relative to the wall mount 104 about the axis extending through the center C of the opening 148 and perpendicular to a rear surface 158 of the back portion 140, the size of the hole required when mounting the arrangement 100 without a junction box is minimized. The aforementioned arrangement 100 does not require a tool or fastener to couple the housing 102 with the wall mount 104 and for decoupling the housing 102 from the wall mount 104.

Referring to FIGS. 3 and 9, the rear surface 158 of the back portion 140 includes a curved projection 149 extending about the opening 148 configured to receive the RF input port 190. In various aspects, the curved projection 149 may be circular or partially circular. As shown in FIG. 9, the wall mount 104 includes flanges 123 that define a substantially circular portion 122a in the center opening 122. The circular portion 122a is sized and arranged to receive the curved projection 149 when the back portion 140 is coupled with the wall mount 104. The flanges 123 extend toward one another and define an entry opening 123a to the circular portion 122a such that a cable can be passed through the entry opening 123a into the circular portion 122a.

In use, the housing 102 includes the back portion 140, the circuit board 170, and the cover 110 integrally connected via fasteners that enter through the rear surface 158 of the back portion and extend through the holes in the circuit board and into the bosses 114 of the cover 110. A coaxial cable extend from a wall is coupled with the port 190, and the housing 102 is then coupled with the wall plate by inserting the first and second latches 150, 152 into the first portions 124a, 126a of the first and second latching openings 124, 126 and rotating the cover clockwise until the first and second latches 150, 152 are aligned with the second portions 124b, 126b of the first and second latching openings 124, 126 in the latched position of the second rotational orientation. To remove the housing 102 from the wall mount 104, a user must press the release member 138c toward the wall in a direction away from the rear surface 158 of the back portion 140 to disengage the locking member 159 from the lock receptacle 139 so that the housing 102 can be rotated in a counter-clockwise direction relative to the wall mount 104 from the second rotational orientation to the first rotational orientation. The housing 102 can then be pulled away from the wall mount 104.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A mounting arrangement for mounting an ethernet bridge enclosure to a wall mount without a tool and while a cable is attached to the enclosure comprising:
    an enclosure portion structurally configured to be coupled with and uncoupled from a mounting portion;
    wherein the enclosure portion is structurally configured to support an ethernet bridge;
    wherein the enclosure portion includes a mounting portion engagement portion;
    wherein the mounting portion is configured to include an enclosure portion engagement portion that is structurally configured to receive the mounting portion engagement portion;
    wherein the enclosure portion is configured to be coupled with the mounting portion in a first orientation by inserting the mounting portion engagement portion through a first portion of the enclosure portion engagement portion of the mounting portion;
    wherein the enclosure portion is configured to rotate relative to the mounting portion in a first direction about an axis that extends in a direction perpendicular to a rear surface portion of the enclosure portion from the first orientation to a second orientation, where the mounting portion engagement portion is disposed at a second portion of the enclosure portion engagement portion of the mounting portion;
    wherein the second portion of the enclosure portion has a smaller dimension than the first portion such that the enclosure portion is prevented from being pulled away from the mounting portion; and
    wherein the enclosure portion is structurally configured to be coupled with and uncoupled from the mounting portion without a tool and while a cable is coupled with the enclosure.

2. The mounting arrangement of claim 1, wherein the enclosure comprises a cover portion and a back portion, the back portion comprises a front surface portion facing the cover portion and an oppositely-facing rear surface portion.

3. The mounting arrangement of claim 2, wherein the back portion includes the mounting portion engagement portion that extends from the rear surface portion, and wherein the enclosure portion is configured to be coupled with the mounting portion in the first orientation by inserting the mounting portion engagement portion of the back portion through the first portion of the enclosure portion engagement portion of the mounting portion.

4. The enclosure of claim 1, wherein the mounting portion comprises a wall mount and the enclosure portion is structurally configured to be coupled with and uncoupled from the wall mount without a tool and while a cable is coupled with the enclosure.

5. The mounting arrangement of claim 3, wherein the mounting portion engagement portion comprise latching members, and the engagement features comprise latch openings.

6. The mounting arrangement of claim 2, wherein the back portion is configured to engage a receptacle in the wall mount when the enclosure is rotated to the second rotational orientation such that the enclosure is prevented from being rotatable relative to the wall mount.

7. The mounting arrangement of claim 2, wherein the wall mount includes a release configured to be urged in a direction away from the back portion to permit the enclosure to be rotated in a second direction from the second rotational orientation to the first rotational orientation where the enclosure can be pulled away from the wall mount.

8. A mounting arrangement for mounting an enclosure to a wall mount without a tool and while a cable is attached to the enclosure comprising:
    an enclosure portion structurally configured to be coupled with and uncoupled from a mounting portion;
    wherein the enclosure portion is configured to include a mounting portion engagement portion;
    wherein the mounting portion is configured to include an enclosure portion engagement portion that is structurally configured to receive the mounting portion engagement portion;
    wherein the enclosure portion is structurally configured to be rotatingly coupled relative to the mounting portion about an axis that extends in a direction perpendicular to a rear surface of the enclosure so as to move between a first orientation, where the mounting portion engagement portion is at a first portion of the enclosure portion engagement portion of the mounting portion, and a second orientation, where the mounting portion engagement portion is at a second portion of the enclosure portion engagement portion of the mounting portion and the enclosure portion is prevented from being uncoupled from the mounting portion; and wherein the enclosure portion is structurally configured to be coupled with and uncoupled from the mounting portion without a tool and while a cable is coupled with the enclosure portion.

9. The mounting arrangement of claim 8, wherein the mounting portion engagement portion extends from a first surface of the enclosure portion.

10. The mounting arrangement of claim 8, wherein the enclosure portion is configured to include an ethernet bridge.

11. The mounting arrangement of claim 8, wherein the enclosure portion includes a cover portion and a back portion.

12. The mounting arrangement of claim 11, wherein the back portion includes a front surface and an oppositely-facing rear surface.

13. The mounting arrangement of claim 8, wherein the engagement portion is configured to extend from the rear surface.

14. The mounting arrangement of claim 11, wherein the back portion is configured to engage a receptacle in the wall mount when the enclosure is rotated to the second rotational orientation such that the enclosure is prevented from being rotatable relative to the wall mount.

15. The mounting arrangement of claim 8, wherein the wall mount includes a release configured to be urged in a direction away from the back portion to release the engagement portion from the receptacle to permit the enclosure portion to be rotated in a second direction from the second rotational orientation to the first rotational orientation where the enclosure portion can be pulled away from the wall mount.

16. The mounting arrangement of claim 8, wherein the engagement portion comprises latching members, and the engagement features comprise latch openings.

17. An enclosure for mounting to a wall mount without a tool or while a cable is attached to the enclosure comprising:
an enclosure portion structurally configured to be coupled with and uncoupled from a mounting portion;

wherein the enclosure portion is structurally configured to be rotatingly coupled relative to the mounting portion so as to move between a first orientation, where the enclosure portion is structurally configured to be coupled with and uncoupled from the mounting portion, and a second orientation, where the enclosure portion is prevented from being uncoupled from the mounting portion; and wherein the enclosure portion is structurally configured to be coupled with and uncoupled from the mounting portion without a tool or while a cable is coupled with the enclosure portion.

18. The enclosure of claim 17, wherein the enclosure portion is structurally configured to be coupled with and uncoupled from the mounting portion without a tool and while a cable is coupled with the enclosure portion.

19. The mounting arrangement of claim 17, wherein the enclosure portion is configured to include an ethernet bridge.

20. The mounting arrangement of claim 17, wherein the enclosure portion is configured to include an engagement portion extending from a first surface of the enclosure portion and a wall mount is configured to include an engagement feature configured to receive the engagement portion.

21. The mounting arrangement of claim 20, wherein the engagement portion is at a first portion of the engagement feature of the wall mount in the first rotational orientation, and the engagement portion is disposed at a second portion of the engagement feature of the wall mount a second rotational orientation.

22. The mounting arrangement of claim 17, wherein the enclosure portion includes a cover portion and a back portion.

23. The mounting arrangement of claim 22, wherein the back portion includes a front surface and an oppositely-facing rear surface.

24. The mounting arrangement of claim 23, wherein the engagement portion is configured to extend from the rear surface.

25. The mounting arrangement of claim 22, wherein the back portion is configured to engage a receptacle in the wall mount when the enclosure portion is rotated to the second rotational orientation such that the enclosure portion is prevented from being rotatable relative to the wall mount.

* * * * *